US009049805B2

(12) United States Patent
Findley et al.

(10) Patent No.: US 9,049,805 B2
(45) Date of Patent: Jun. 2, 2015

(54) THERMALLY-CONDUCTIVE PARTICLES IN PRINTED WIRING BOARDS (75) Inventors: David Findley, Fort Worth, TX (US); Robert James Hill, Cupertino, CA (US)

(73) Assignee: Lockheed Martin Corporation, Bethesda, MD (US)

(*) Notice: Subject to any disclaimer, the term of this patent is extended or adjusted under 35 U.S.C. 154(b) by 192 days.

(21) Appl. No.: 13/599,475

(22) Filed: Aug. 30, 2012

(65) Prior Publication Data

US 2014/0060898 A1 Mar. 6, 2014

(51) Int. Cl.
| H05K 1/03 | (2006.01) |
| H05K 3/28 | (2006.01) |
| H05K 3/46 | (2006.01) |
| H05K 1/02 | (2006.01) |
| H05K 3/34 | (2006.01) |

(52) U.S. Cl.
CPC ........... *H05K 3/284* (2013.01); *Y10T 29/49124* (2015.01); *H05K 1/0203* (2013.01); *H05K 1/0373* (2013.01); *H05K 3/3447* (2013.01); *H05K 3/4626* (2013.01); *H05K 2201/0209* (2013.01); *H05K 2201/029* (2013.01)

(58) Field of Classification Search
CPC ............. H01L 23/3732; H05K 1/0373; H05K 1/0366; H05K 2201/0209; H05K 2201/029; H05K 1/03; H05K 1/11; H05K 1/0209
See application file for complete search history.

(56) References Cited

U.S. PATENT DOCUMENTS

| H1471 H | * | 8/1995 | Braun et al. ................... 361/704 |
| 5,451,352 A | * | 9/1995 | Cook ............................. 264/102 |
| 5,786,075 A | * | 7/1998 | Mishuku et al. .............. 428/325 |
| 7,224,039 B1 |   | 5/2007 | McGuire et al. |
| 8,309,210 B1 | * | 11/2012 | Keen ............................. 428/209 |
| 2002/0157859 A1 | * | 10/2002 | Vasoya et al. ................ 174/250 |
| 2005/0025967 A1 | * | 2/2005 | Lawton et al. ................ 428/375 |
| 2005/0095410 A1 | * | 5/2005 | Mazurkiewicz .............. 428/209 |
| 2008/0019098 A1 | * | 1/2008 | Sung ............................. 361/706 |
| 2008/0078570 A1 | * | 4/2008 | Japp et al. .................... 174/256 |
| 2008/0144291 A1 | * | 6/2008 | Hu et al. ....................... 361/720 |
| 2008/0160286 A1 |   | 7/2008 | Asrar et al. |
| 2009/0047502 A1 | * | 2/2009 | Folaron et al. ............... 428/327 |
| 2010/0040672 A1 |   | 2/2010 | Ho et al. |
| 2010/0259910 A1 | * | 10/2010 | Hayashi et al. .............. 361/783 |

* cited by examiner

*Primary Examiner* — Tuan T Dinh
*Assistant Examiner* — Steven T Sawyer
(74) *Attorney, Agent, or Firm* — Reising Ethington P.C.; John J. Snyder (57) ABSTRACT A printed wiring board (PWB) can be fabricated with enhanced thermal characteristics that can enable the use of higher performance electronic components and/or a smaller packaging configuration. A substrate layer of the PWB includes a matrix material and optional reinforcing fibers embedded in the matrix material. The matrix material and/or the reinforcing fibers may include thermally-conductive particles such as nanodiamonds that increase the thermal conductivity of the substrate layer. Holes may be formed through the substrate layer for receiving and/or electrically connecting electronic components. The thermally-conductive particles are sized sufficiently small to allow the formation of the holes through the substrate layer using conventional equipment and processes such as drilling. The PWB may also include a protective coating that comprises thermally-conductive particles. The thermally-conductive particles described herein can reduce the need for heavy and bulky metal thermal layers in a manufacturing-friendly manner.

18 Claims, 4 Drawing Sheets

THERMALLY-CONDUCTIVE PARTICLES IN PRINTED WIRING BOARDS

TECHNICAL FIELD

This application relates generally to printed wiring boards for use in electronics applications and, more particularly, to materials for use in printed wiring boards.

BACKGROUND

Printed wiring boards (PWBs), also referred to as printed circuit boards, are a mainstay of modern electronics. PWBs have enabled economically feasible manufacturing of complex electronic systems at least partly due to PWBs' ability to accommodate the formation of hundreds of intercomponent electrical connections in a single soldering operation. As electronic devices and systems evolve, they are often expected to provide more utility while using less space and/or less material. For example, in aerospace applications, it is almost always desirable to reduce both the physical size and weight of electronic systems to conserve space for the primary functions of an aircraft or spacecraft and to minimize the energy required to move the aircraft or spacecraft from one location to another. In consumer electronics, an overall desire for mobility is a driver for smaller and lighter-weight designs. One limitation for size and weight reduction can be related to waste heat generated by electronic device components during operation. In other words, to avoid overheating, which can lead to reduced performance or premature failure, some electronic systems are packaged in a larger space than is physically necessary to accommodate them. In applications where electronic systems are absolutely limited to a smaller space than is thermally allowable, lower performance electronic components that generate less heat must be used. Metal heat sinks or other components, such as heat pipes, designed to help move waste heat away from the electronic components do so at the expense of additional weight and/or space.

SUMMARY

In accordance with one embodiment, a multilayer printed wiring board includes a substrate layer and an electrically conductive trace layer bonded with the substrate layer. The substrate layer comprises a matrix material and diamond particles, and a hole is formed at least partially through the substrate layer. The hole can accommodate electrical connection of the trace layer to an electronic component and/or to another electrically conductive trace layer.

In accordance with another embodiment, a multilayer printed wiring board includes a substrate layer and an electrically conductive trace layer bonded with the substrate layer. The substrate layer comprises a matrix material and thermally-conductive three-dimensional nanoparticles distributed throughout substantially the entire thickness of the substrate layer.

In accordance with another embodiment, a method of making a multilayer printed wiring board includes the steps of: (a) bonding a plurality of material layers together, (b) forming a hole at least partially through a diamond-containing portion of the bonded layers, and (c) operatively attaching an electronic component to the bonded layers. At least one of the material layers in step (a) comprises diamond particles and at least one of the material layers in step (a) is an electrically conductive trace layer.

BRIEF DESCRIPTION OF THE DRAWINGS

These and other features and advantages will become apparent to those skilled in the art in connection with the following detailed description and drawings of one or more embodiments, in which.

DETAILED DESCRIPTION

A printed wiring board (PWB) can be fabricated with enhanced thermal characteristics that can enable the use of higher performance electronic components and/or a smaller packaging configuration. A substrate layer of the PWB, including a matrix material and/or reinforcing fibers embedded in the matrix material, may include nanodiamond or other thermally-conductive particles that increase the thermal conductivity of the substrate layer compared to the matrix material alone. Holes may be formed through the substrate layer for receiving and/or electrically connecting electronic components. Nanodiamond particles may be sized sufficiently small to allow the formation of the holes through the substrate layer using conventional equipment and processes such as drilling. The PWB may also include a protective coating disposed over at least a portion of an electronic component, and the coating may include nanodiamond particles as well. The PWB may include one or more integrated circuits with chip package bodies that include nanodiamond into their ceramic or polymer matrix. Collectively, these represent a holistic approach to thermal conductivity enhancement in electronic systems and can reduce the need for heavy and bulky metal thermal layers, heat sinks, or heat pipes that are sometimes used in multilayer PWBs to conduct heat away from the electronic components.

Figure 1:
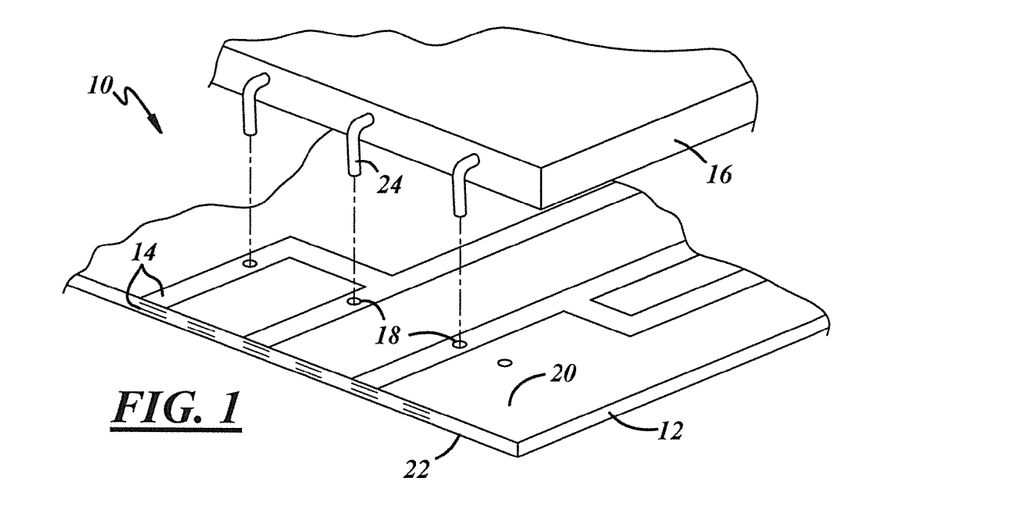
FIG. 1 is an exploded view of a portion of an embodiment of a multilayer printed wiring board.

Referring to FIG. 1, there is shown an exploded view of a portion of a multilayer PWB 10, according to one embodiment. The multilayer PWB 10 includes a substrate layer 12 and one or more electrically conductive trace layers 14 bonded with the substrate layer 12. The PWB 10 also includes one or more electronic components 16, such as a processor, a memory component, an integrated circuit (IC), a resistor, a capacitor, a transistor, or an LED, for example. Each electronic component 16 is in electrical connection with at least one of the trace layers 14 and/or another electronic component. In this example, the PWB 10 includes a plurality of trace layers 14, some of which are bonded with the substrate layer 12 within the thickness of the substrate layer. The PWB 10 also includes one or more holes 18 formed at least partially through the substrate layer 12 to accommodate electrical interconnection of trace layers 14 and/or electrical connection of the electronic component 16 with one or more of the trace layers. The substrate layer 12 has a component side 20 where the electronic component(s) are located and an opposite side 22, where electronic components may or may not be present. The PWB 10 may also include a protective coating (not shown in FIG. 1) disposed over at least a portion of an electronic component. Though the need for heat pipes and heat sinks may be lessened as described herein, these types of components can be optionally included.

In its simplest form, the multilayer PWB 10 includes a single trace layer 14 bonded with the substrate layer 12 at the side 22 of the substrate layer opposite the electronic components 16 or within the thickness of the substrate layer. Holes 18 are formed through the substrate layer 12 and the trace layer 14, and conductive portions of the electronic component(s), such as metal legs 24, extend through the layers from the component side 20 to the opposite side 22. Solder connections between the metal legs 24 and the trace layer may then be formed at the opposite side of the substrate layer using conventional methods such as wave soldering. Other types of electrical connections may be formed between the electronic component 16 and the trace layer 14, such as press-fit connections or component-side solder connections. Though the electronic components shown in the figures extend through holes of the PWB, the teachings presented herein are also applicable to PWBs with surface-mounted electronic components.

As used here, the substrate layer 12 is the layer of material that the trace layer(s) are bonded to or within and provides the structural integrity of the PWB, allowing the electronic components 16 and trace layers to be handled together. While it is possible to have more than one substrate layer 12, the substrate layer is considered a single layer through its thickness between opposite sides 20, 22 in the illustrated PWBs. The substrate layer 12 may be formed from multiple separate layers fused or bonded together, but is considered one layer of material in the finished PWB 10. As will be described in greater detail below, the substrate layer includes a matrix material and may also include reinforcing fibers and/or thermally-conductive particles that are intended to provide the substrate layer with increased thermal conductivity. An electrically conductive trace layer 14 is a layer of electrically conductive material that is electrically connected with an electronic component 16 and/or with other trace layers in the finished PWB. Copper and its alloys are widely used, but other electrically conductive materials could be used without departing from these teachings. Each trace layer 14 may be formed with a specific pattern or "trace" a specific path along the substrate layer to electrically connect various parts of the PWB to with one another. As used here, the term trace layer also encompasses power layers and ground layers, where included.

Figure 2:
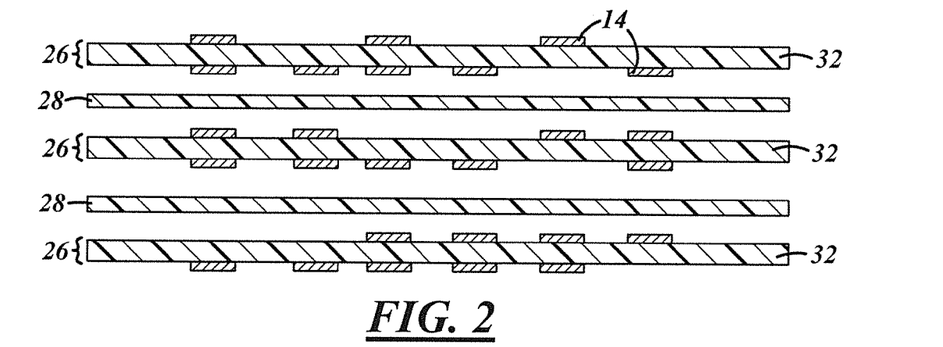
FIG. 2 is a cross-sectional view of a portion of a plurality of layers of material that may be bonded together to form a portion of a printed wiring board.
Figure 3:
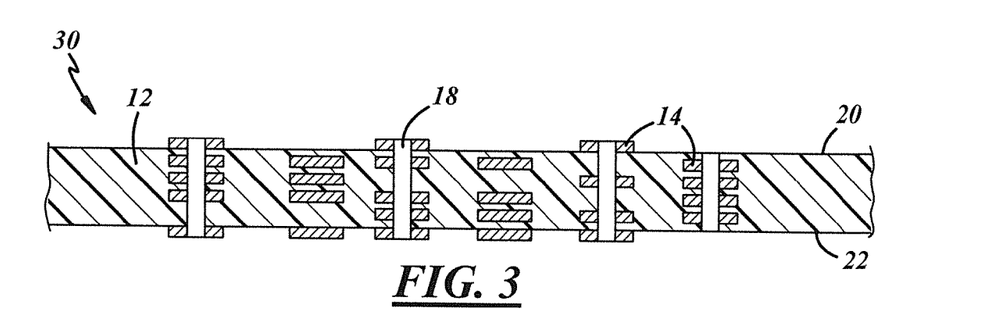
FIG. 3 is a cross-sectional view of a layered structure for a printed wiring board formed by bonding the material layers of FIG. 2 together.
Figure 4:
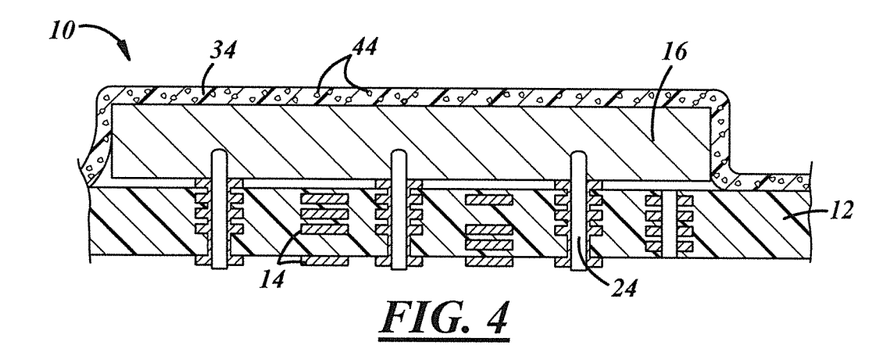
FIG. 4 is a cross-sectional view of a printed wiring board, including the layered structure of FIG. 3.

FIGS. 2-4 illustrate an example of a multilayer PWB 10 having a plurality of electrically conductive trace layers 14, with each of FIGS. 2-4 showing the PWB 10 in a different stage of construction. FIG. 2 shows a plurality of individual layers, including laminate layers (or laminates) 26 and interposed material layers 28, before being bonded together to form a layered board structure 30 shown in FIG. 3. The illustrated example includes six trace layers 14. Each of the trace layers 14 is provided as part of one of the laminate layers 26 in this example. Each laminate layer 26 includes a core layer of material 32 with a trace layer 14 bonded to each of its opposite surfaces. Copper-clad laminates are one type of laminate layer 26. Copper-clad laminates may be originally provided with continuous layers of copper foil electrodeposited or otherwise bonded over the entire opposite surfaces of the core layer of material 32. A mask and etch procedure or other type of selective material removal process may be used to form each trace layer 14 to the desired configuration. Material layers 28 are interposed between successive laminate layers 26 as necessary to isolate opposing trace layers 14 that would otherwise contact each other in the layered structure 30 when pressed together. In some embodiments, the interposed material layers 28 may be substantially the same in composition as the core layers 32 of the laminate layers 26.

FIG. 3 shows the layered board structure 30 formed by bonding the individual layers of FIG. 2 together using known techniques that may include various combinations of heat, pressure, and time. The resulting layered structure 30 includes the substrate layer 12 and a plurality of trace layers 14 bonded to or within the substrate layer 12. The trace layers 14 are stacked one over another, and portions of the substrate layer 12 are interposed between successive trace layers. The core layers of material 32 and the interposed material layers 28 may deform during the bonding process to wrap the edges of each embedded trace layer 14. Layers 28 and 32 may also be fused during the bonding process to form the solid substrate layer 12 in which some of the trace layers 14 are embedded. After the bonding process, holes 18 can be formed through the layered structure 30. Each hole 18 may be located to corresponded with the location of a trace layer 14. Holes 18 are provided to accommodate electrical interconnection of different trace layers 14 and/or electrical connection of electronic components to one or more of the trace layers. For example, the holes 18 may be electroplated after formation to electrically connect different trace layers within the layered structure 30 through which an individual hole passes. Other techniques may be used to form such electrical connections or vias between trace layers, such as placing a conductive insert or plug in a hole 18, as not all holes need be left open to receive electrical components.

FIG. 4 shows the finished PWB 10 after an electronic component 16 is added, with conductive portions 24 extending through the layered structure 30. FIG. 4 also shows an optional protective coating 34 disposed over the electronic component 16. The protective coating 34 is a layer of material provided to protect underlying components from one or more environmental conditions, such as moisture, radiation, corrosive gases, dust, etc. The material for the protective coating 34 should have a sufficiently high dielectric constant so that it does not create unwanted electrical connections among the covered components and is preferably transparent. Parylene is one suitable protective layer material, but other polymer-based materials may also be suitable. The protective coating 34 may include the thermally-conductive particles 44 described below to help conduct heat away from the covered electronic components and maybe disposed over at least a portion of an electronic component 16, an entire electronic component, a plurality of electronic components, or may be present at substantially the entire component side of the PWB.

The illustrated constructions are merely examples of the types of PWBs and PWB components that can benefit from the present disclosure. For example, the PWB may include any number of trace layers. The layered structure of FIG. 3 could be formed from laminate layers 26 having a trace layer 14 bonded to only one side of the core layer 32, with or without interposed material layers 28. One or more of the conductive portions 24 of the electronic component may extend only partially through the layered structure 30. Or one or more of the holes 18 may be formed only partially through the thickness of the layered structure 30. These are only a few of the possible variations.

Figure 5:
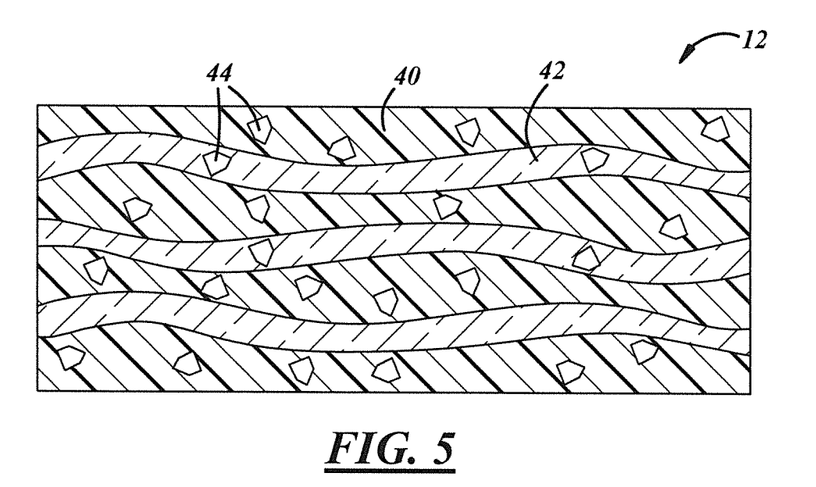
FIG. 5 is an enlarged cross-sectional view of one embodiment of a substrate layer, including a matrix material, reinforcing fibers, and thermally-conductive particles.

FIG. 5 is an enlarged cross-sectional view of one embodiment of the substrate layer 12. As previously mentioned, the substrate layer 12 of the PWB includes a matrix material 40 and may include reinforcing fibers 42 and/or thermally-conductive particles 44 that are intended to impart the substrate layer with enhanced thermal conductivity. The composition of the matrix material 40, when the substrate layer is formed as shown in FIGS. 2 and 3, is dependent on the compositions of the core layers 32 of the laminates 26 and the interposed material layers 28. It may be preferable that each of the core layers and interposed layers 32, 28 have the same general composition or are from the same material family so that the matrix material 40 in the formed substrate layer 12 is generally the same throughout. Suitable matrix materials 40 include the cure products of polyimide resins or epoxy resins. Polytetrafluoroethylene (PTFE) is another suitable matrix material. In some applications, the matrix material 40 may be a ceramic material. Other polymeric materials may also be suitable, provided they have sufficient dielectric constants to act as electrical insulators at the required scale.

Where provided, the reinforcing fibers 42 are elongated elements embedded or encapsulated in the matrix material. The reinforcing fibers 42 may be continuous or semi-continuous fibers woven together and originally provided in sheet form, or they may be long or short chopped fibers distributed in the matrix material 40. For example, referring again to FIG. 2, the reinforcing fibers 42 may be provided in woven sheet form as part of the core layers 32 of the laminates 26 and/or as part of the interposed material layers 28. In one embodiment, each of the interposed material layers 28 may be referred to as a prepreg layer, including a woven sheet of reinforcing fibers 42 impregnated with uncured or partially cured polymer or pre-ceramic polymer that will become the matrix material 40 when cured. Suitable pre-ceramic polymer materials include polyhydridocarbyne (PHC) and polymethylsilyne (PMS), which may respectively yield polycrystalline hexagonal diamond and polycrystalline silicon carbide matrices. Each of the core layers 32 may be similarly constructed, with the impregnating resin sufficiently cured for purposes of handling. The reinforcing fibers may be selected from a variety of glass fibers, carbon fibers, aramid fibers, polymer fibers (e.g. PTFE fibers), or other suitable fibers. In one embodiment, the reinforcing fibers are omitted from the PWB or only selectively included within the board thickness. It may be the case, for example, that the thermally-conductive particles are present in the matrix material in an amount that provides the matrix material with sufficient integrity and/or stiffness for handling or for use in the finished PWB without the need for reinforcing fibers.

The thermally-conductive particles 44 may be distributed within the matrix material 40, the reinforcing fibers 42, or both, as shown in FIG. 5. As used herein a thermally-conductive particle is a particle comprising a material having a thermal conductivity of at least 400 W/K-m. Particles 44 may have other distinguishing characteristics as well, related to their size, shape, composition or properties. Diamond particles, silicon carbide particles, and silver particles are non-limiting examples of thermally-conductive particles 44. Diamond particles may be preferred due to a good combination of high thermal conductivity (e.g., from about 1000-2500 W/m-K) and low electrical conductivity. Diamond particles are also three-dimensional (3D) particles, meaning that they have an aspect ratio of about 5 or less. This shape allows the particles 44 to conduct heat relatively isotropically—in three dimensions rather than in only two dimensions as may be the case with high aspect ratio particles. Other 3D-particle compositions may be possible. In one embodiment, the thermally-conductive particles are isothermally-conductive particles, meaning that they conduct thermal energy substantially equally in all directions. These particles 44 may optionally be functionalized—i.e., certain chemical functional groups may be added or substituted at the particle surfaces to compatibilize the particles with the material in which they are included.

Where the thermally-conductive particles 44 are diamond particles, it may be necessary to address other characteristics of the particles, such as the abrasiveness of the diamond particles. As described above, it is sometimes desired to form one or more holes through the substrate layer 12. But diamond can cause excessive wear on conventional cutting tools such as drill bits. Providing the diamond in particle form is already advantageous to reduce tool wear when compared to a continuous layer of diamond, for example. Tool wear may be further reduced by sufficiently reducing the average size of the particles 44. In one embodiment, the particles 44 are nanoparticles. Where the particles 44 are diamond particles, they may be referred to as nanodiamonds. As used here, nanoparticles are particles having a largest dimension of 100 nm or less. In one particular embodiment, the particles 44 are nanoparticles having an average size ranging from 6-10 nm. Detonation nanodiamonds (DND) are one suitable type of diamond particles that can enhance the thermal conductivity of the substrate layer 12 in a manner that minimizes tool wear. Nanoparticles may also allow for higher particle loading in the matrix material 40 or the reinforcing fibers 42 with less of an effect on the other material properties of the filled material than would be the case with larger particles. An additional advantage of nanoscale diamond particles compared to microscale diamond particles is a reduced effect from thermal expansion and contraction. Nano-silicon carbide (nSiC) and nanosilver (nAg) particles are other examples of nanoparticles, though the effects of the electrically conductivity of metallic nanoparticles must be considered.

In one embodiment, at least some of the thermally-conductive particles 44 are distributed within the matrix material 40. The particles 44 may be present in an amount from 0.5 wt % to 85 wt % when taken together with the matrix material 40. In other words, the particles 44 make up 0.5% to 85% of the substrate layer 12 by weight, exclusive of the reinforcing fibers 42. In another embodiment, the thermally-conductive particles are present in an amount of at least 50% by weight, exclusive of the reinforcing fibers. The particle loading in the matrix material 40 may be adjusted to balance various considerations, with higher particle content being preferred for higher thermal conductivity, but lower particle content allowing for less tool wear and better pre-cure layer integrity. In other words, the matrix material pre-cursor acts as a binder for the particles 44 and should be present in an amount that allows for adequate handling of laminates or prepreg layers. In one example, detonation nanodiamonds (DNDs) are mixed with an uncured polymer such as polyimide in a weight ratio of 85% DND and 15% polymer. This mixture is rolled into sheet form to a thickness of about 0.001 inches (1 mil). The resulting sheet can then be one of a plurality of layers of material that are bonded together under heat and pressure to form the layered structure of FIG. 3, for example. Other layers may include one or more layers of reinforcing fiber and one or more trace layers. In this example, the matrix material 40 and particles 44 can be infused into and through the layer(s) of reinforcing fibers 42 during the bonding process.

In another embodiment, at least some of the thermally-conductive particles 44 are distributed within the reinforcing fibers 42. The particles 44 may be present in an amount from 0.5 wt % to 65 wt % of the fibers 42. In one specific example, DND powder is mixed with pot melt glass in a weight ratio of 61% DND and 39% glass base, and the mixture is spun into fiber form. The fibers can be woven into sheet form and be one of a plurality of layers of material that are bonded together under heat and pressure to form the layered structure of FIG. 3, for example. The resulting fiber sheet can also be impregnated with matrix material 40, with or without thermally-conductive particles 44 being distributed within the matrix material. The fiber composition may vary depending on several variables, such as the base fiber material (e.g., glass, aramid, etc.) and the desired mechanical properties of the fibers. Where present in both the matrix material 40 and the reinforcing fibers 42, the particles 44 distributed within each may be the same, or they may vary in amount, size, shape, or composition. In one embodiment, the substrate layer 12 has thermally-conductive particles 44 distributed in the matrix material through its entire thickness. In another embodiment, the substrate layer 12 has thermally-conductive particles 44 distributed through its entire thickness, including through reinforcing fibers 42 embedded in the matrix material 40.

Providing thermally conductive material in the form of particles 44 such as nanodiamonds allows the entire thickness of the substrate layer 12 to be a thermal conductor with the ability to conduct heat away from the electronic components of the PWB, and this thermal conduction may be isotropic in nature. This can reduce or eliminate the need for dedicated thermal layers in the layered structure of the PWB, or the need for heat sinks or heat pipes. Some conventional PWB constructions include such thermal layers, which are usually relatively thick, full metal layers, to draw heat away from the PWB. But these types of thermal layers are heavy and utilize valuable packaging space, and waste heat from the electronic components must still be conducted through thermally insulating materials to reach the thermal layer. Constructing a PWB as described above can enable a substrate layer 12 in which the only metal layers are the electrically conductive trace layers. This may result in the additional benefit of reducing the overall weight of the PWB due at least in part to less metal usage.

The above-described thermally-conductive particles 44 may be additionally or alternatively included in the protective coating 34 (FIG. 4) where such a coating is present. While the protective coating 34 is useful to protect underlying electronic components, it may act as a thermal insulator in the absence of thermally-conductive particles, causing the components to operate at increased temperatures. The particles may be present in the protective coating in an amount from 0.5 wt % to 50 wt % of the coating material. In one specific example, DND powder is mixed with parylene in a weight ratio of 50% DND and 50% parylene, and the mixture is coated over the substrate layer and the attached electronic components. The coating may be applied as a conformal coating via chemical vapor deposition (CVD), or by other methods such as solution evaporation or powder spray and fuse. Thus, any one or more of the matrix material of the substrate layer, the reinforcing fibers, or the protective coating may include the above-described thermally-conductive particles, resulting in a finished PWB from which waste heat can be readily removed.

Figure 6:
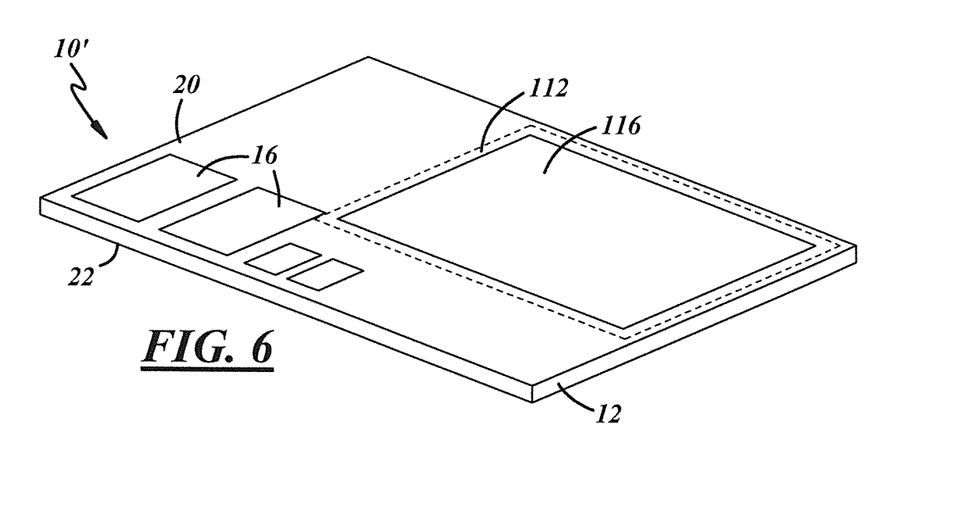
FIG. 6 is a perspective view of an embodiment of a printed wiring board with a plurality of electronic components and a thermal region.

In at least some implementations, the thermally-conductive particles are selectively included within the substrate layer. Some portions of the substrate layer may include the particles, and others may not. Or the concentration of particles in one portion of the substrate layer may be higher than in another portion of the substrate layer. One example is illustrated in FIG. 6, where there is shown a PWB 10' with a plurality of electronic components 16, 116. Some electronic components, such as CPUs or LEDs for example, may operate at higher temperatures than others. In this example, the substrate layer 12 includes a thermal region 112, located within the dashed line in FIG. 6 and corresponding in location with CPU 116. The thermal region 112 is characterized by a higher thermal conductivity than the other regions of the substrate layer 12. The higher thermal conductivity may be provided by the thermally-conductive particles as described above, so that the thermal region 112 has a higher concentration of such particles than another region of the substrate layer. The higher concentration may be due to thermally-conductive particles in the matrix material, reinforcing fibers, or both. Thus only the portions of the PWB that operate hottest have enhanced thermal conductivity. There may be more than one thermal region, and each thermal region may be characterized by different levels of enhanced thermal conductivity.

This selective inclusion of the thermally-conductive particles may be accomplished in a variety of ways. For example, the conductive particles can be distributed in patches of matrix material, smaller in size than the finished PWB, and included in the multi-layer bonding process described above. In another example, the thermally-conductive particles may be solvent-borne and ink-jet printed or otherwise patterned onto a layer of matrix material or onto a layer of reinforcing fibers. The thermal region 112 of the substrate layer 12 refers to a projected area of the layer, and the thermally-conductive particles may be present throughout the thickness of the substrate layer in the thermal region, or only in a portion of the overall thickness of the substrate layer. For example, in the multi-layer bonding process, one or more layers may include the thermally-conductive particles in the intended thermal region, while other layers may not. Or one layer may have a different concentration of such particles than another layer.

Figure 7:
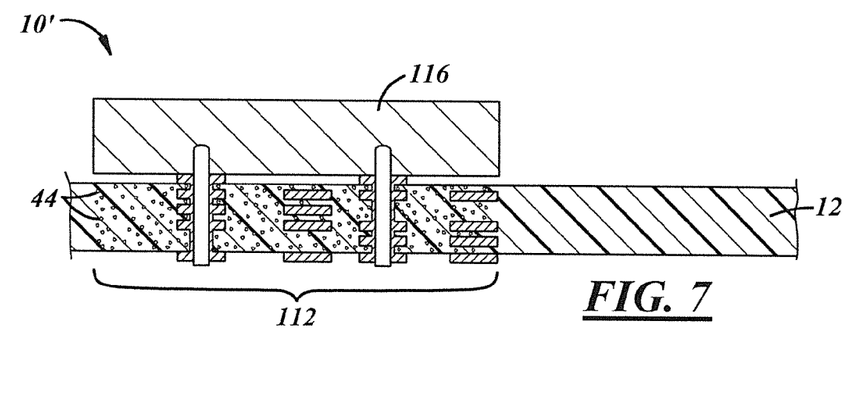
FIG. 7 is a cross-sectional view of an embodiment of a printed wiring board, showing thermally-conductive particles in a thermal region of the substrate layer.

FIG. 7 is a cross-sectional view of an example of a PWB 10' where the concentration of thermally-conductive particles 44 is higher in a first portion of the substrate layer 12 than in a second portion of the substrate layer. The illustrated example is like that of FIG. 6, in which the particle 44 concentration is higher in the thermal region 112 of the substrate layer 12 than in other regions of the substrate layer. The thermal region 112 underlies CPU 116 or some other electronic component.

Figure 8:
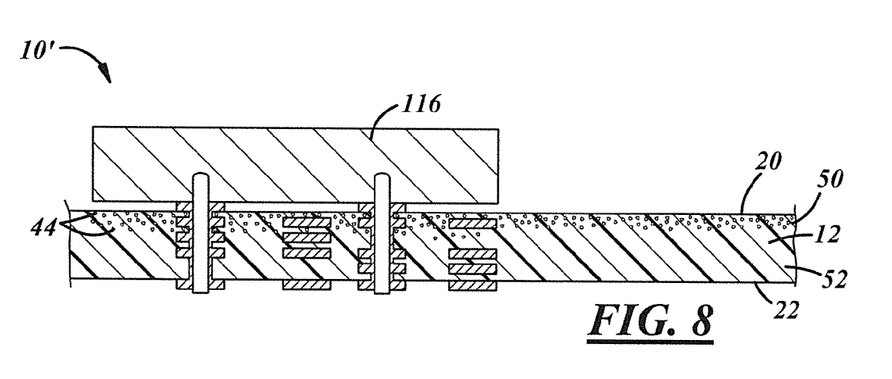
FIG. 8 is a cross-sectional view of an embodiment of a printed wiring board, showing thermally-conductive particles at a higher concentration at a component side of the substrate layer than at an opposite side.

In another embodiment, the concentration of the thermally-conductive particles in the substrate layer 12 varies within the thickness of the substrate layer, whether or not any thermal regions 112 are present. For example, as illustrated in FIG. 8, the concentration of thermally-conductive particles 44 is higher in portion 50 of the substrate layer 12, located at the component side 20, than in portion 52 of the substrate layer, located at the opposite side 22. The substrate layer 12 may thus have a gradient in thermal conductivity through the thickness of the substrate layer. Maximizing the thermal conductivity of the substrate layer 12 at the component side 20 can allow waste heat from electronic components to be distributed along the entire area of the substrate layer to eliminate hot spots on the PWB. In some applications, this result may be sufficient, and enhanced thermal conductivity through the remainder of the substrate layer may be unnecessary. In this case, the particle-containing portion of the substrate layer 12 may function in the manner of a thermal layer, except that it can be constructed from non-metal materials and thus be present at the surface of the component side 20 of the substrate layer so that heat is distributed across the entire PWB as soon as it is produced. Thermal conductivity as a function of distance from the substrate layer surfaces can be controlled by controlling the concentration of the thermally-conductive particles 44 in the individual layers used in the multi-layer bonding process.

Figure 9:
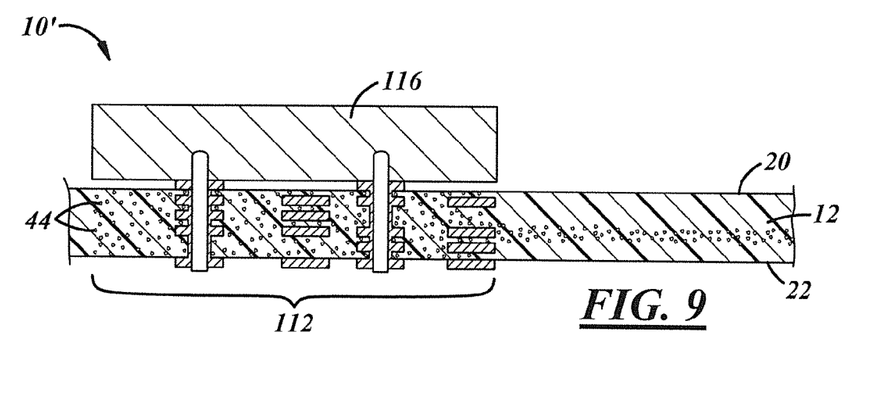
FIG. 9 is a cross-sectional view of an embodiment of a printed wiring board, showing thermally-conductive particles arranged to form a 3D thermal pathway in the substrate layer.

In combination, selective inclusion of the thermally-conductive particles to certain regions of the substrate layer along with varying the amount of such particles through the thickness of the substrate layer results in the ability to tailor a 3D thermal pathway through the substrate layer 12. For example, with reference to FIG. 9, the substrate layer 12 may be fabricated so that only the thermal region 112 has a high concentration of thermally-conductive particles 44 from the component side 20 of the board and partially through the thickness of the substrate layer, at which point the substrate layer has a high concentration of the thermally-conductive particles 44 spanning the entire area of the PWB. Thus, waste heat from the hottest electronic components, such as CPU 116, can be drawn away from the component side 20 of the substrate layer 12 before, and/or at a higher rate, than it is distributed in other directions. Or a 3D thermal pathway can be designed to route waste heat in a specific direction through the substrate layer 12, such as toward a thermally conductive housing or some other external heat sink. In another embodiment, one or more holes of the PWB is filled with matrix material or any other material that includes thermally conductive particles 44 to form a thermal via in the PWB.

Figure 10:
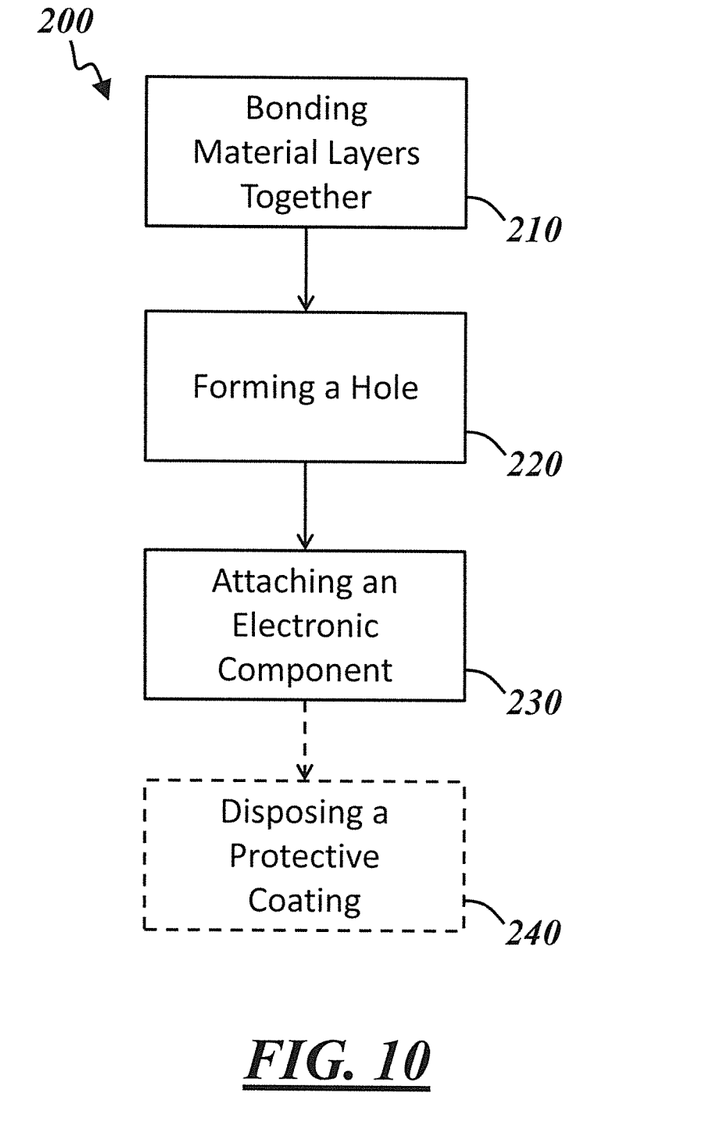
FIG. 10 is a process flow diagram showing an embodiment of a method of making a multilayer printed wiring board.

FIG. 10 is a process flow chart illustrating one embodiment of a method 200 of making a multilayer printed wiring board. The illustrative method includes steps 210-230, including: bonding a plurality of material layers together, forming a hole at least partially through the bonded layers, and operatively attaching an electronic component to the bonded layers. Step 210 is the bonding step, and may include the multi-layer bonding process described in conjunction with FIGS. 2 and 3. The bonding step 210 may also include an electroplating process. For example, a layer of metal material such as copper may be plated onto a core layer of material, thus bonding the layers of material together, as may be the case in the fabrication of the laminate layers 26 of FIG. 2. Adhesive bonding or any other type of bonding may be used. In this embodiment, at least one of the material layers is an electrically conductive trace layer, and at least one of the material layers includes thermally-conductive particles, such as diamond particles or nanodiamonds. The thermally conductive particles may be included in a prepreg layer, a laminate layer, a layer of reinforcing fibers, a layer of matrix material precursor, or any other layer and in any combination.

Step 220 includes forming a hole through a portion of the bonded layers that includes the thermally-conductive particles, such as a diamond-containing portion of the bonded layers. Conventional hole-forming techniques may be used, such as drilling, laser-cutting, burning, etching, etc. As noted above, the hole walls may be electroplated with a metal such as copper to electrically interconnect different trace layers within the PWB. The attaching step 230 may include soldering or any other technique for forming an electrical connection between the electronic component and a trace layer or another component. The method may further include the optional step 240 of disposing a protective coating over at least a portion of the electronic component, and the coating may include thermally-conductive particles as described above. The method may include one or more additional steps or, in some cases, certain steps may be omitted.

It is to be understood that the foregoing is a description of one or more illustrative embodiments of the invention. The invention is not limited to the particular embodiment(s) disclosed herein, but rather is defined solely by the claims below. For example, it is possible that a PWB include a dual-function structure/surface that is both a PWB and load-bearing structure. One example may be a relatively small electronic device, such as a hand-held smart-phone, with a body which is both a back-case structure and a PWB. Another example may be a relatively large automobile component, such as a hood or trunk lid, that is a composite load-bearing shape with PWB elements incorporated into that shape (e.g. high-definition LED displays, collision radar, etc.). Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. A multilayer printed wiring board, comprising:
   an electrically insulating substrate layer comprising a matrix material and diamond particles, the substrate layer further comprising reinforcing fibers embedded in the matrix material, wherein at least some of the diamond particles are distributed within the reinforcing fibers;
   an electrically conductive trace layer bonded with the substrate layer;
   a hole formed at least partially through the substrate layer to accommodate electrical connection of the trace layer to an electronic component and/or to another electrically conductive trace layer.

2. The multilayer printed wiring board of claim 1, wherein at least some of the diamond particles are distributed within the matrix material.

3. The multilayer printed wiring board of claim 1, further comprising:
   a plurality of electrically conductive trace layers stacked one over another, wherein portions of the substrate layer are interposed between successive trace layers, and the hole is formed through at least one interposed portion.

4. The multilayer printed wiring board of claim 1, further comprising:
   an electronic component electrically connected to the trace layer;
   a protective coating disposed over at least a portion of the electronic component, wherein the protective coating comprises diamond particles.

5. The multilayer printed wiring board of claim 1, wherein the diamond particles are nanodiamonds.

6. The multilayer printed wiring board of claim 1, wherein the concentration of diamond particles is higher in a first portion of the substrate layer than in a second portion of the substrate layer.

7. The multilayer printed wiring board of claim 3, wherein the electrically conductive trace layers are metal layers and are the only substantially metal layers within the thickness of the substrate layer.

8. The multilayer printed wiring board of claim 4, wherein diamond particles are distributed within the matrix material.

9. The multilayer printed wiring board of claim 6, wherein the first portion is at a component side of the substrate layer and the second portion is at an opposite side of the substrate layer.

10. The multilayer printed wiring board of claim 6, wherein the first portion is a thermal region of the substrate layer that underlies an electronic component of the wiring board.

11. A multilayer printed wiring board, comprising:
a substrate layer comprising a matrix material, reinforcing fibers embedded in the matrix material, and thermally-conductive three-dimensional nanoparticles distributed throughout substantially the entire thickness of the substrate layer; and
an electrically conductive trace layer bonded with the substrate layer,
wherein at least some of the nanoparticles are nanodiamonds distributed within the reinforcing fibers.

12. The multilayer printed wiring board of claim 11, wherein the nanoparticles are nanodiamonds.

13. The multilayer printed wiring board of claim 11, wherein the nanoparticles are present in the substrate layer in an amount from 0.5 wt % to 85 wt %.

14. The multilayer printed wiring board of claim 11, further comprising:
an electronic component electrically connected to the trace layer;
a protective coating disposed over at least a portion of the electronic component, wherein the protective coating comprises thermally-conductive particles.

15. The multilayer printed wiring board of claim 13, wherein the nanoparticles are present in the substrate layer in an amount of at least 50 wt %.

16. A multilayer printed wiring board, comprising:
an electrically insulating substrate layer comprising a matrix material and reinforcing fibers embedded in the matrix material, wherein the reinforcing fibers include nanodiamonds mixed within a base fiber material; and
an electrically conductive trace layer bonded with the substrate layer, wherein the nanodiamonds have an aspect ratio of about 5 or less and comprise a material having a thermal conductivity of at least 400 W/K-m.

17. The multilayer printed wiring board of claim 16, wherein the reinforcing fibers are woven together as a fiber sheet embedded in the matrix material, the base fiber material is glass.

18. The multilayer printed wiring board of claim 16, further comprising:
an electronic component electrically connected to the trace layer;
a protective coating disposed over at least a portion of the electronic component; and
nanodiamonds distributed within the matrix material, within the protective coating, or within both.

* * * * *